Dec. 9, 1969 W. O. LUETZE 3,483,484

MULTIVIBRATOR

Filed Feb. 27, 1968

*INVENTOR*

WILHELM O. LUETZE

BY Joseph L. Spiegel

ATTORNEY 3,483,484
Patented Dec. 9, 1969

3,483,484

MULTIVIBRATOR

Wilhelm O. Luetze, Boblingen, Germany, assignor to International Business Machines Corporation, Armonk, N.Y., a corporation of New York Filed Feb. 27, 1968, Ser. No. 708,628
Claims priority, application Germany, Apr. 27, 1967, J 33,548
Int. Cl. H03k 3/28
U.S. Cl. 331—113 5 Claims

ABSTRACT OF THE DISCLOSURE

To improve a multivibrator, that means to render it essentially independent of the absolute operating voltages, changes in the ambient temperatures and the aging of the semiconductor devices used, the collector of two multivibrator transistors controls an associated AVC amplifier, the output of which is coupled to the base of the associated multivibrator transistor. Each of the multivibrator transistors in conjunction with an associated reference potential transistor forms one current switch. During change over of the multivibrator, the collector potential is compared with the base potential on the one hand, and the rising base voltage of the multivibrator transistor is clamped on the other when the reference potential on the reference potential transistor is being approached, thus ensuring an ideal level of response for the reference potential.

BACKGROUND OF THE INVENTION

The invention relates to a multivibrator circuit with two multivibrator transistors which are mutually coupled from their respective collectors to their respective bases.

It is a shortcoming of multivibrator circuits of this kind that their pulse frequency and the duty cycle of the pulses applied are essentially governed by their absolute operating voltages, changes in the ambient temperature and the aging of their semiconductor devices. Although in many cases, when using such multivibrators, adequate accuracy is ensured by taking relatively expensive measures to overcome the disadvantages indicated, the fact remains that a sufficiently high degree of accuracy and fully satisfactory operation are not readily obtainable. The service characteristics of known multivibrators fall short of those which an ideal multivibrator is expected to have.

It is the object of the invention to provide an ideal multivibrator circuit, the pulse frequency and duty cycle of which are essentially independent of the absolute operating voltage, changes in the ambient temperature and the aging and drift of the semiconductor devices employed. The design of the circuit must be simple so that it can be manufactured by methods equal to those used for integrated circuits.

SUMMARY OF THE INVENTION

In accordance with the invention the problem is solved in that one AVC amplifier each, through its input, is additionally connected to the collector of a multivibrator transistor and, through its noninverting output, by means of a semiconductor device which is only conductive when the associated multivibrator transistor is in its conductive state, to the base of the same multivibrator transistor, and in that the multivibrator transistors, when acting together with at least one current switch element, form a current switch for providing a reference voltage.

This ensures that the step function when changing over the multivibrator is determined by the AVC amplifier of the invention rather than being produced in a high- or low-saturation inverter. As the reference voltage applied allows the multivibrator transistors to be switched when the base voltage of the inhibited multivibrator transistor approaches the reference voltage, the invention, in contrast to the prior art, provides a constant duty cycle and pulse frequency.

Thus, for example, the application of a zero reference voltage causes the change over of the multivibrator transistors to coincide with the zero-axis crossing of the base voltage, of the appropriate multivibrator transistor.

A particularly advantageous embodiment of an AVC amplifier comprises a second current switch arranged between the collector connection of the multivibrator transistor and the base connection of the AVC amplifier, operated as an emitter follower, and to the second input of which a reference voltage is applied.

Current switches are known per se (cf. Steinbuch, Taschenbuch der Nachrichtenverarbeitung by Springer, Berlin, p. 476). Such switches cause a transistor, which has been rendered conductive by the application of a reference voltage, to be set OFF when to the base of a transistor, the emitter of which is linked with the emitter of the reference voltage transistor, a signal is applied causing the transistor to be conductive and the reference voltage transistor to be cut-off. The emitter resistor is so chosen that the current flowing through it is almost constant, regardless of which of the transistors is conductive. It is also possible for one of the transistors to be replaced by a correpondingly biased diode.

In contrast to this, the current switches of the invention can be so operated that in the first state of the current switch the reference voltage transistor is fully conductive, while the other transistor is inhibited, but that in the second state the total current rate is apportioned equally to the two transistors. In this instance, too, the current flow through the emitter resistor common to the two transistors remains at an almost constant level, regardless of the state of the current switch.

A further embodiment of the circuit of the invention is characterized in that the multivibrator feedback to the collector of a multivibrator transistor rather than being linked with the collector connection, is connected to the output of the second current switch, thus ensuring an ideal level of response on the base of the multivibrator transistor by tapping the step function during the change over of the multivibrator in the AVC amplifier.

The use of separate emitter supply connectors allows the multivibrator transistors to be used in a known manner as components of a current switch, by connecting to the emitter of a multivibrator transistor a reference voltage transistor with its emitter and by applying to the base of the reference voltage transistor the reference voltage.

In accordance with an advantageous embodiment of the invention, such a circuit arrangement can be considerably simplified by connecting the two emitter supply connectors of the multivibrator transistors, through a joint emitter resistor to the appropriate supply source. The first current switch is formed by connecting the emitter of the reference voltage transistor to the point of connection of the emitter resistor with the emitters of the multivibrator transistors. A capacitor connected to the reference potential source $V_{REF}$ from the point of connection of the two multivibrator transistors further improves this circuit, by rendering ineffective temporary phenomena, if any, occurring when changing over the multivibrator. Where only slight fluctuations in the operating voltage are liable to occur, the required constancy of the multivibrator is also obtainable without a special reference voltage transistor being connected.

The circuit arrangement of the invention can be used to equal advantage for unstable, monostable and bistable multivibrators. The monostable and bistable multivibrators of the invention are controlled in a known manner. However, this control can also be applied to any suitable point within the AVC amplifier.

BRIEF DESCRIPTION OF THE DRAWING

Further advantages of the invention are described in the succeeding specification and patent claims and are shown by means of embodiments in the following drawing wherein:

DESCRIPTION OF THE PREFERRED EMBODIMENTS

Figure 1:
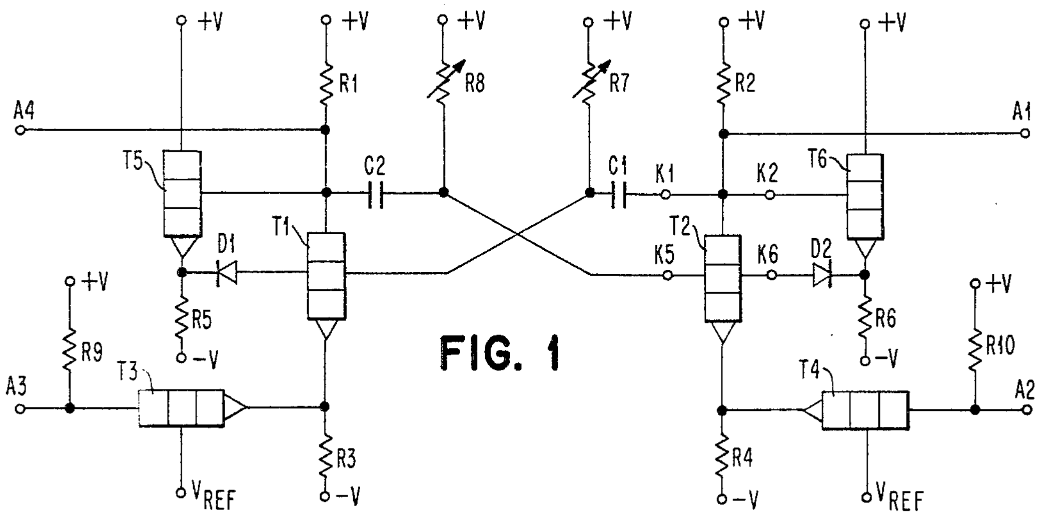
FIGURE 1 is a schematic of a circuit of a multivibrator of the invention.

In the circuit arrangement of FIGURE 1 the multivibrator comprises the transistors T1 and T2, the emitter of which through their emitter resistors R3 and R4 are connected to a negative potential source —V, and the collectors of which, through their operating resistors R1 and R2, are linked with a positive potential source +V. This embodiment and the other embodiments shown are provided with npn transistors, but with appropriately changed operating potentials being used, pnp transistors can be employed to equal advantage. The collector of transistor T1 is connected to the base of a second transistor T2 through a timing network comprising the capacitor C2 and the variable resistor R8, whereas the collector of the transistor T2 is coupled to the base of the first transistor T1 through a second timing network consisting of the capacitor C1 and the variable resistor R7. An emitter resistor R3 is arranged between the emitter of the first transistor T1 and the associated negative operating potential source —V, whereas the emitter resistor R4 is located between the emitter of the second transistor and the associated negative operating potential source —V. The point of connection of the emitter to its associated emitter resistor is arranged in each case on an associated additional transistor T3 or T4, to the bases of which the reference voltage $V_{REF}$ is applied, and the collectors of which are connected both to an output A3 or A2 and an associated collector resistor R9 or R10. Further outputs A4 and A1 are arranged in a known manner on the collectors of the transistors T1 and T2. The emitter resistors R3 and R4 are so dimensioned that both the transistor T1 with the transistor T3 and the transistor T2 with the transistor T4 each form a current switch. The collector of the transistor T2, through a terminal K2, is connected to the base of a transistor T6 which is operated as an emitter follower. The emitter of the transistor T6, through an emitter resistor R6 is connected to the negative operating potential source —V and, through a diode D2 and a terminal K6, to the base of the associated transistor T2. In the same manner, the collector of the transistor T1 is connected to the base of a further transistor T5, the emitter of which, through the emitter resistor R5, is also connected to the negative operating potential source —V, and which is also operated as an emitter follower. The emitter of the transistor T5, through a diode D1, is linked with the base of the associated transistor T1. Diodes D1 and D2 are so poled that they are conductive at the same time as the associated multivibrator transistor T1 or T2 is conductive. The collector resistors R1 and R2 and the emitter resistors R3 and R4 of the transistors T1 and T2 are so dimensioned that the current flow through the emitter resistors R3 or R4 is essentially independent of the operative state of the transistors T1 and T2, since during the inoperative state of the transistors T1 and T2 a current is forced through the emitter resistor R3 or R4 by the associated reference voltage transistors T3 and T4.

Transistor T2, for example, when conductive, causes the associated transistor T6 to become slightly conductive so that diode D2, which is inhibited when the transistor T6 is in its highly conductive state, is opened, preventing the transistor T2 from being saturated. At the same time the current flow through the reference voltage transistor T4 is reduced. The same applied, in analogy, to the interaction of the transistors T1, T3 and T5. In contrast to multivibrator circuit already known that means when earth potential is applied to the emitters of the transistors T1 and T2 and for which the level of response on the base of transistor T1 and T2 is approximately 0.7 V., which value depends upon the absolute base/emitter voltage of the transistor used, the level of response of the circuit of the invention is determined as a function of the reference potential $V_{REF}$ on the base of the reference voltage transistor T3 or T4. As previously stated, the emitter currents of transistors T1 and T3 and T2 and T4 respectively are essentially the same, at the switching threshold provided the resistors R1, R9 and R3 and R2, R10, and R4 respectively are appropriately dimensioned. This feature allows the difference between the absolute response potential on the base of transistor T1 or T2 and the reference potential $V_{REF}$ on the base of transistor T3 or T4 to be kept small in contrast to known arrangements.

The difference in the potential can be reduced to some millivolt in a case where the transistor and its associated reference voltage transistor as a matched transistor pair are incorporated in the same semiconductor chip. In such a case the difference is practically negligible. Apart from this, such an arrangement provides ideal conditions of temperature compensation for the base emitter diodes of the transistors T1 and T3 and T2 and T4 respectively.

The use of the AVC amplifier of the invention, as described above, results in the voltage drop on the collector resistor R2 being accurately limited to a value of $+V-V_{REF}$, since, when the transistor T2 becomes conductive, the decreasing potential on its collector is detected by means of the transistor T6 and compared with the base potential of transistor T2. Depending upon the result of the comparison, the collector current of the transistor T2 is changed through the base current of the same transistor until the potential on the terminal K2 is almost identical to the reference potential $V_{REF}$.

In other words, in this instance the collector potential is scanned and controlled in accordance with the zero-axis crossing. In addition, the rising base voltage on the transistor T2 is clamped when the value of the reference potential $V_{REF}$ is being approached. In the special case under consideration, this could be described as a limiting effect obtained during the zero-axis crossing of the base potential.

The above description referring to the right half of the multivibrator of the circuit arrangement of FIGURE 1 applies analogously to the left half.

The multivibrator arrangement described provides adequate means to ensure that a defined level of response, that means the value of the reference potential $V_{REF}$, is obtained on the base of the transistor T2 through the application of nearly identical currents for the transistors T2 and T4.

Figure 2:
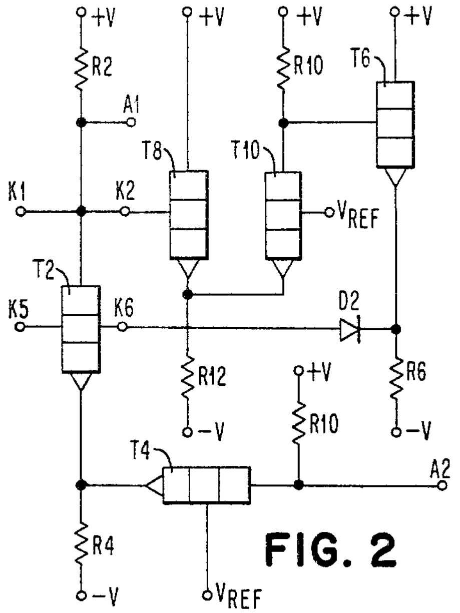
FIGURE 2 is a schematic of the right-hand side of an alternative embodiment of the multivibrator of the invention.
Figure 3:
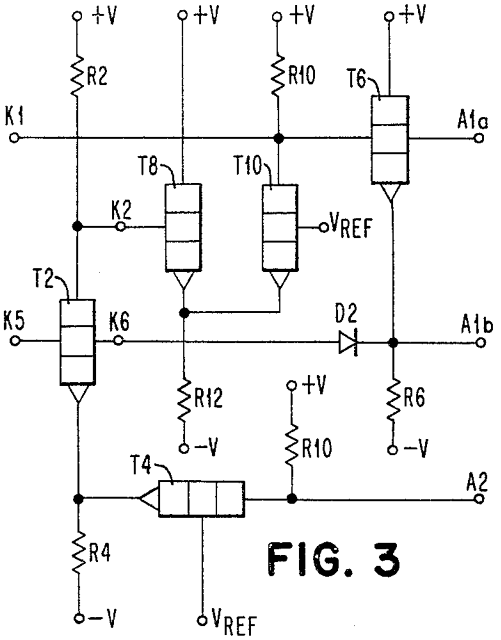
FIGURE 3 is a schematic of the right-hand side of a further alternative embodiment of the multivibrator of the invention.

As the multivibrator circuit, with the exception of the timing network, which can be chosen at random, is essentially of symmertical design, further embodiments of the invention are described by means of FIGURES 2 and 3 only with reference to the right half of the multivibrator. The left half of the multivibrator would be attached to the terminals K1 and K5 through links comprising timing networks. For an appreciation of the invention, a description of only one multivibrator half shall suffice. The circuit arrangement of the embodiment shown in FIGURE 2 differs from the embodiment of FIGURE 1 in that the transistor T6, rather than being controlled directly by the collector of transistor T2, is set by a special current switch. This current switch consists of two transistors T8 and T10 which are connected to each other through their emitters, the base of the first transistor T8 being connected to the collector of the transistor T2, and the base of the second transistor T10 being linked with the reference potential source $V_{REF}$. The collector of the second transistor T10 is connected to the base of the transistor T6. Regarding this current switch, the current flowing through the emitter resistor R12 is almost independent of the switching state of the transistors T8 and T10 and is essentially constant. This feature is ensured by the emitter resistor R12 and the collector resistor R10, linked with the collector of the second transistor T10, being suitably dimensioned.

During operation, the current flow through the first transistor T8, with multivibrator T2 being conductive, is only reduced when the base voltage of the first transistor T8 has dropped below the value of the reference potential $V_{REF}$, thus causing the second transistor T10 to become conductive, so that, subsequently, the two transistors T8 and T10 each use almost the same emitter current, and that the two emitter currents in their totality are approximately equal to the current flowing through the first transistor T8 in its highly conductive state. In a special case, the collector potential of the multivibrator transistor T2 can be scanned for and adjusted to a zero-axis crossing by means of the improved circuit arrangement, since the potential on the terminal K2 is almost equal to the value of the reference potential $V_{REF}$. Apart from this, the base voltage on the multivibrator transistor T2 is clamped when the value of the reference potential $V_{REF}$ is being approached.

The design of the circuit of the embodiment in accordance with FIGURE 3 is essentially the same as that of FIGURE 2, the only difference being that the terminal K1, rather than being connected to the collector of the multivibrator T2, is directly linked with the output of the additional current switch, that means with the collector of the transistor T10 and thus with the base of the transistor T6. This ensures, that in addition to a well defined level of response $V_{REF}$ being obtained on the base of the multivibrator transistors T1 and T2, the collector potential of the multivibrator transistors T1 and T2 is adjusted to a value which is almost identical to the reference potential at the time when the additional current switch formed by the transistors T8 and T10 is switched to its alternative state. This means that an ideal level of response on the base of the multivibrator transistors T1 and T2 is ensured by waiting for the accurate value for the voltage drop on the collector resistor R2 to occur, which, in the special case under consideration of the zero axis crossing of the potential on the terminal K2 precedes the actual change over the multivibrator transistors T1 and T2. The step function is tapped within the AVC amplifier. In addition to the output A1*a* which is connected, through the terminal K1, to the collector of the multivibrator transistor T10, an output A1*b* can be linked with the point of connection of the diode D2 with the emitter of the transistor T6. The same applies to the left half of the multivibrator.

Figure 4:
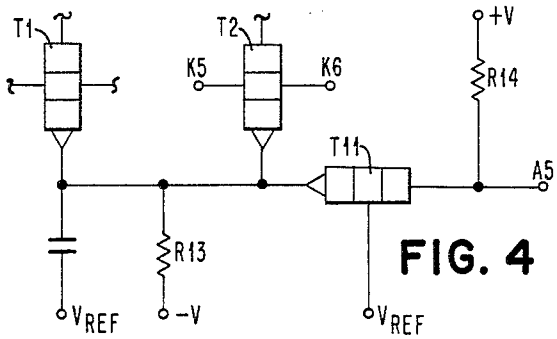
FIGURE 4 is a schematic emitter circuit arrangement of still a further alternative embodiment of a multivibrator of the invention.

The multivibrator circuit of the invention can be simplified, by connecting to each other and feeding through a joint emitter resistor the emitters of the two transistors T1 and T2. This circuit arrangement, as shown in FIGURE 4, can be so designed that the two transistors T1 and T2 are operated as current switches. This in turn would obviate the use of the current switch transistors T3 and T4 of the preceding embodiments. As in such a case an absolute reference voltage would not be available for the bases of the multivibrator transistors T1 and T2, the effect of fluctuations in the operating voltages, although being enhanced, would still be less noticeable than in known multivibrator circuits so that under certain conditions the circuit suggested could be used in practice, particularly since on account of the AVC amplifiers employed, changes in the ambient temperature and the drift and aging of the semiconductor devices would have no lasting effect on the operation.

Detrimental effects, if any, can be easily eliminated, as shown in FIGURE 4, by connecting a transistor T11, in the form of a grounded base circuit, with its emitter to the point of connection of the two emitters of the multivibrator transistors T1 and T2 to the emitter resistor R13. As the collector voltage of the transistor T11 is introduced through a collector resistor R14, linked with its other side with an output A5, and the reference voltage $V_{REF}$ is applied to the base of the transistor T11, the interaction of the multivibrator transistors T1 and T2 on the one hand and the additional transistor T11 on the other result in a current switch comprising three transistors. The emitter resistor R13, when suitably dimensioned, ensures that the reference voltage value $V_{REF}$ is absolutely kept when the multivibrator transistors T1 and T2 start to respond. The operating characteristics of the multivibrator thus designed depend upon the difference in the potential between the base connections of the multivibrator transistors T1 and T2, whereas the absolute value of the switching potential, on account of the reference voltage $V_{REF}$ applied, is governed by a third transistor T11. To eliminate the effect of temporary phenomena during the relatively short change over period of the multivibrator, the point of connection of the emitters of the two multivibrator transistors T1 and T2 can be linked with the reference potential source $V_{REF}$ or the negative potential source $-V$ through a capacitor.

The value of the reference potential $V_{REF}$ can be chosen at random within the limits imposed by the breakdown voltage of the semi conductor devices. Either two potentials, that means $+V$ and $-V$ with the earth potential serving as a reference potential, or only one positive or one negative potential source with an earth potential can be used, the reference potential $V_{REF}$ being formed or controlled internally in a known manner. In a practical embodiment the negative potential source has a value of $-6$ v. and the positive potential source a value of $+3$ v., whereas the reference potential source is earthed.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In a multivibrator having a pair of multivibrator transistors mutually coupled from their respective collectors to their respective bases, the improvement comprising:
   - an AVC amplifier having an input and a non-inverting output;
   - said amplifier input being connected to the collector of one of said multivibrator transistors;
   - a semiconductive device which is conductive only when said one multivibrator transistor is in its conductive state;
   - said amplifier output being connected to the base of said one multivibrator transistor through said semiconductive device; and
   - a current switch element, said one multivibrator transistor being associated therewith and forming with said element a first current switch for providing a reference voltage.

2. The invention defined by claim 1 including:
   - a second current switch having an input and an output and being adjusted in accordance with said reference voltage;
   - a transistor operated as an emitter follower;
   - the collectors of said multivibrator transistors being connected to the input of said second current switch;

the output of said second current switch being connected to the base of said emitter follower transistor; and the emitter of said second current switch being connected to the base of said one multivibrator transistor through said semiconductive device.

3. The invention defined by claim 2 wherein:

said multivibrator transistors have feedback loops connected to the output of said second current switch.

4. The invention defined by claim 1 wherein:

said current switch is operated as a grounded base circuit;

the emitter of said current switch is connected to the emitter of said one multivibrator transistor; and said reference voltage is applied to the base of said current switch element.

5. The invention defined by claim 1 including:

a joint emitter supply connector for said multivibrator transistors;

said current switch element being operated as a grounded base circuit;

said reference voltage being applied to the base of said current switch element; and the emitter of said current switch element being connected to said joint emitter supply connector.

References Cited

FOREIGN PATENTS 1,238,070 4/1967 Germany.

JOHN KOMINSKI, Primary Examiner

U.S. Cl. X.R.

307—292; 328—200